(12) United States Patent
Parent et al.

(10) Patent No.: US 7,101,492 B2
(45) Date of Patent: Sep. 5, 2006

(54) FLUORINATED SURFACTANTS FOR AQUEOUS ACID ETCH SOLUTIONS

(75) Inventors: Michael J. Parent, Oakdale, MN (US); Patricia M. Savu, Maplewood, MN (US); Richard M. Flynn, Mahtomedi, MN (US); Zhongxing Zhang, Woodbury, MN (US); William M. Lamanna, Stillwater, MN (US); Zai-Ming Qiu, Woodbury, MN (US); George G. I. Moore, Afton, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 2 days.

(21) Appl. No.: 11/081,196

(22) Filed: Mar. 16, 2005

(65) Prior Publication Data
US 2005/0181620 A1    Aug. 18, 2005

Related U.S. Application Data

(62) Division of application No. 10/290,763, filed on Nov. 8, 2002, now Pat. No. 6,890,452.

(51) Int. Cl.
*C09K 13/00* (2006.01)
(52) U.S. Cl. ..................... 252/79.1; 438/745
(58) Field of Classification Search ........ 438/689, 438/745, 753–757; 252/79.1–79.5
See application file for complete search history.

(56) References Cited

U.S. PATENT DOCUMENTS

| | | | | |
|---|---|---|---|---|
| 4,055,458 | A | * | 10/1977 | Niederprum et al. ......... 216/97 |
| 4,370,254 | A | | 1/1983 | Mitschke et al. |
| 4,582,624 | A | | 4/1986 | Enjo et al. |
| 4,795,582 | A | | 1/1989 | Ohmi et al. |
| 5,085,786 | A | | 2/1992 | Alm et al. |
| 5,478,436 | A | | 12/1995 | Winebarger et al. |
| 5,587,513 | A | * | 12/1996 | Pohmer et al. ............... 564/84 |
| 5,688,884 | A | | 11/1997 | Baker et al. |
| 5,755,989 | A | | 5/1998 | Ishii et al. |
| 5,803,956 | A | | 9/1998 | Ohmi et al. |
| 5,944,907 | A | | 8/1999 | Ohmi |
| 6,310,018 | B1 | | 10/2001 | Behr et al. |
| 6,348,157 | B1 | | 2/2002 | Ohmi et al. |
| 6,491,983 | B1 | * | 12/2002 | Moore et al. ............... 427/445 |
| 6,552,090 | B1 | * | 4/2003 | Behr et al. ..................... 516/25 |
| 6,890,452 | B1 | | 5/2005 | Parent et al. |
| 2002/0089044 | A1 | | 7/2002 | Simmons et al. |
| 2003/0036569 | A1 | | 2/2003 | Lamanna et al. |
| 2003/0153780 | A1 | * | 8/2003 | Haniff et al. ............... 558/199 |
| 2004/0089840 | A1 | | 5/2004 | Parent et al. |

FOREIGN PATENT DOCUMENTS

| | | |
|---|---|---|
| DE | 30 38985 A1 | 5/1982 |
| EP | 0 073 863 A1 | 3/1983 |
| GB | 1037857 | 8/1966 |
| WO | WO 97/46283 A1 | 12/1997 |
| WO | WO 01/30873 A1 | 5/2001 |
| WO | WO 02/092211 A2 | 11/2002 |
| WO | WO 2004/044091 A1 | 5/2004 |
| WO | WO 2004/044092 A1 | 5/2004 |

OTHER PUBLICATIONS

S. Raghavan, "Surfactants in Wet Processing of Silicon", International Symposium on Ultraclean Processing of Silicon Surfaces, (1997), pp. 317-322, Department of Materials Science and Engineering, University of Arizona, Tucson, AZ.
A. M. Almanza, "Adsorption of a Polyglycidol Surfactant From HF and BHF Solutions at Silicon/Solution and Solution/Air Interfaces", Abstract, Symposium Q, Ultraclean processing of Semiconductor Structures and Devices, (Apr. 7-8, 1999), Materials Research Society [on line], [available and retrieved on the internet Jul. 30, 2002], <http://www.mrs.org/> pp. 1-2.
D. C. Burkman, "Understanding and Specifying the Sources and Effects of Surface Contamination in Semiconductor Processing", Microcontamination, (Nov. 1988), pp. 57-62, 107-112.
K. M. Shah, "Change Your Surfactant Formula and Use Etch Baths for a Week", Semiconductor International, (Oct. 1988), pp. 132-134.
P. D. Haworth, "Interaction of a Polyglycidol-Based Nonionic Surfactant with Silicon in Hydrofluoric Acid Solutions", Journal of the Electrochemical Society, (1999), pp. 2284-2288, vol. 146, No. 6.
J. S. Jeon, "Effect of Temperature on the Interaction of Silicon with Nonionic Surfactants in Alkaline Solutions", Journal of the Electrochemical Society, (Jan. 1996), pp. 277-283, vol. 143, No. 1.
J. S. Jeon, Electrochemical Investigation of Copper Contamination on Silicon Wafers from HF Solutions, Journal of the Electrochemical Society, (Sep. 1996), pp. 2870-2875, vol. 143, No. 9.
A. M. Almanza-Workman, "In Situ ATR-FTIR Analysis of Surfactant Adsorption onto Silicon from Buffered Hydrofluoric Acid Solutions", Langmuir, (2000), pp. 3636-3640, vol. 16, No. 8, 2000 American Chemical Society.
M. Miyamoto, "Prevention of Microroughness Generation on the Silicon Wafer Surface in Buffered Hydrogen Fluoride by a Surfactant Addition", Journal of the Electrochemical Society, (Oct. 1994), pp. 2899-2903, vol. 141, No. 10, The Electrochemical Society, Inc.
"ICKnowledge", Aluminum Etch, 2001 IC Knowledge [on line], [retrieved from the internet on Apr. 14, 2003], <http://www.icknowledge.com/glossary/a.html>, pp. 1-4.
"Terra Universal Process Control Application Chart", Terra Universal [on line], [retrieved from the internet on Apr. 14, 2003], <http://www.terrauniversal.com/products/wetprocess/processcontrol.html>, pp. 1-2.
"Metal Wet Bench wbmetal Operating Instructions", "9.2 Aluminum Etch", Stanford Nanofabrication Facility [on line], [last modified Aug. 14, 2000], [retrieved from the internet on Apr. 14, 2003], <http://snf.stanford.edu/Equipment/wbmetal/Operation.html>, pp. 1-14.

(Continued)

*Primary Examiner*—Kin-Chan Chen
(74) *Attorney, Agent, or Firm*—Kent S. Kokko

(57) ABSTRACT

Novel aqueous, acid etch solutions comprising a fluorinated surfactant are provided. The etch solutions are used with a wide variety of substrates, for example, in the etching of silicon oxide-containing substrates.

18 Claims, No Drawings

OTHER PUBLICATIONS

"Boe® Premixed Etchants, A complete range of useful thermal oxide etching rates", Technical Data: Boe® Buffered Oxide Etchants, General Chemical, (2000), pp. 1-8.

R. A. Guenthner, "Surface Active Materials from Perfluorocarboxylic and Perfluorosulfonic Acids", I & EC Product Research and Development, (Sep. 1962), pp. 165-169, vol. 1, No. 3.

H. Kikuyama, "Surface Active Buffered Hydrogen Fluoride Having Excellent Wettability for ULSI Processing", IEEE Transactions on Semiconductor Manufacturing, (Aug. 1990), pp. 99-108, vol. 3, No. 3.

G. A. Olah, "Chapter 8 Fluorination with Onium Poly (Hydrogen Fluorides): The Taming of Anhydrous Hydrogen Fluoride for Synthesis", Synthetic Fluorine Chemistry, (1992), pp. 163-204, John Wiley & Sons, Inc.

L. A. Zazzera, "XPS and SIMS Study of Anhydrous HF and UV/Ozone-Modified Silicon (100) Surfaces", Journal of the Electrochemical Society, (Feb. 1989), pp. 484-491, vol. 136, No. 2.

* cited by examiner

FLUORINATED SURFACTANTS FOR AQUEOUS ACID ETCH SOLUTIONS

This application is a divisional of U.S. Ser. No. 10/290,763, filed Nov. 8, 2002, now, U.S. Pat. No. 6,890,452 the disclosure of which is herein incorporated by reference.

FIELD OF THE INVENTION

The present invention is directed to certain fluorinated surfactants, and use thereof in aqueous acid etch solutions. The etch solutions are used with a wide variety of substrates, for example, in the etching of silicon oxide-containing substrates.

BACKGROUND

The use of microelectronic devices, such as integrated circuits, flat panel displays and microelectromechanical systems, has burgeoned in new business and consumer electronic equipment, such as personal computers, cellular phones, electronic calendars, personal digital assistants, and medical electronics. Such devices have also become an integral part of more established consumer products such as televisions, stereo components and automobiles.

These devices in turn contain one or more very high quality semiconductor chips containing many layers of circuit patterns. Typically nearly 350 processing steps are required to convert a bare silicon wafer surface to a semiconductor chip of sufficient complexity and quality to be used, for example, in high performance logic devices found in personal computers. The most common processing steps of semiconductor chip manufacture are wafer-cleaning steps, accounting for over 10% of the total processing steps. These cleaning steps are normally one of two types: oxidative and etch (or both). During oxidative cleaning steps, oxidative compositions are used to oxidize the silicon or polysilicon surface, typically by contacting the wafer with aqueous peroxide or ozone solution. During etch cleaning steps, etching compositions are used to remove native and deposited silicon oxide films and organic contaminants from the silicon or polysilicon surface before gate oxidation or epitaxial deposition, typically by contacting the wafer with aqueous acid. See, for example, L. A. Zazzera and J. F. Moulder, *J. Electrochem. Soc.*, 136, No. 2, 484 (1989). The ultimate performance of the resulting semiconductor chip will depend greatly on how well each cleaning step has been conducted.

Microelectromechanical systems (MEMS) (also called micromachines or micromechanical devices) are small mechanical devices that can be made using traditional integrated circuit manufacturing techniques. Typical devices include motors, gears, accelerometers, pressure sensors, actuators, mirrors, biochips, micropumps and valves, flow sensors and implantable medical devices and systems. The manufacture of MEMS may result in a chip, or die, which contains the moving pieces of the device made from silicon or polycrystalline silicon (polysilicon) encased in silicon oxide. The die can also contain the circuitry necessary to run the device. One of the final steps in the manufacture of silicon-based MEMS is commonly referred to as "release-etch" and consists of an aqueous etch utilizing hydrofluoric acid (HF) to remove the silicon oxide to free, or "release", the silicon or polysilicon pieces and allow them to move.

For etch cleaning steps, the composition of choice has been dilute aqueous hydrofluoric acid (HF) and, to a lesser extent, hydrochloric acid (HCl). Currently, many semiconductor fabricators employ an "HF-last" etch cleaning process consisting of an etching step using dilute aqueous HF to etch oxides.

In the wet etching of an oxidized silicon substrate, aqueous hydrogen fluoride or a mixture with an onium fluoride complex may be used as an etchant. The onium fluoride present serves to adjust the etching rate and stabilize the solution to variation in HF concentration. These buffered oxide etch solutions, or BOEs have a high surface tension and, as a result, may not adequately wet a substrate or penetrate microscopic surface features.

SUMMARY OF THE INVENTION

The present invention provides an aqueous etch solution comprising an acid; and a surfactant of the formula:

$$R_f\text{-}Q\text{-}R^1\text{—}SO_3^-M^+ \quad (I)$$

wherein $R_f$ is a $C_1$ to $C_{12}$ perfluoroalkyl group, $R^1$ is —$C_nH_{2n}$(CHOH)$_o$$C_mH_{2m}$—, wherein n and m are independently 1 to 6, and o is 0 or 1, and wherein $R^1$ optionally contains a catenary oxygen or nitrogen atom; $M^+$ is a cation; and Q is —O—, or —$SO_2NR^2$—, wherein $R^2$ is H, an alkyl, aryl, hydroxyalkyl, aminoalkyl or sulfonatoalkyl. The solution may further comprise an onium fluoride compound, such as ammonium fluoride, and may further comprise a second fluorinated surfactant, such as perfluoroalkylsulfonamido salt.

The fluorinated surfactant is sufficiently stable in the aqueous acid etch solution, and advantageously reduces the surface tension thereof so that nanoscale features may be effectively provided to a silicon substrate, such as an integrated circuit and is soluble in the aqueous acid solution. The solution of the instant invention provides one or more of the following advantages; the solution has the same etch rate as conventional etch solutions, possesses low surface tension resulting in low contact angles between the solution and substrate. In addition it is non-foaming, low in particulates that may contaminate a substrate and leaves low or no surface residues on rinse. It also offers improved stability of performance when filtered or after extended storage and affords excellent substrate surface smoothness.

The etch solution of the present invention is particularly suitable for the etching of oxidized silicon substrates, where the acid is hydrofluoric acid (HF) and/or an onium fluoride complex thereof. Other substrates, including metals and oxides may also be etched and cleaned by appropriate selection of acid or mixtures of acids.

In one aspect, this invention relates to an etch solution useful in semiconductor and integrated circuit manufacture, the composition comprising a fluorinated surfactant, hydrogen fluoride and/or onium complex thereof. Advantageously, the present invention provides an aqueous etch solution useful for etching, and removal of residues, that contains a relatively low concentration of surfactant, but effectively wets the substrate and has an efficient rate of etching. Substrates useful in the present invention include silicon, germanium, GaAs, InP and other III–V and II–VI compound semiconductors. It will be understood, due to the large number of processing steps involved in integrated circuit manufacture, that the substrate may include layers of silicon, polysilicon, metals and oxides thereof, resists, masks and dielectrics. The present invention is also particularly useful in the etch and release of silicon-based microelectromechanical (MEMS) devices. The etch cleaning and drying of MEMS has similar issues to those for semiconductor chip manufacture.

In another aspect, this invention relates to an etch process for substrates by contacting a substrate with a homogeneous etch solution comprising the fluorinated surfactant and acid for a time sufficient to achieve a predetermined degree of etching. In a preferred embodiment, this invention relates to a etch process for substrates by contacting an oxidized silicon substrate with a homogeneous etch solution comprising the fluorinated surfactant, HF and/or onium fluoride complex for a time sufficient to achieve a predetermined degree of etching. The present invention provides an etch solution with low surface tension that easily penetrates the intricate microstructures and wets the surfaces on silicon substrates. If desired, the etch process may further comprise the step of rinsing the etch solution from the surface of the etched substrate, and the step of drying the substrate.

In another aspect, the present invention provides a buffered oxide etch solution (BOE, also known as buffered hydrogen fluoride or BHF) comprising an aqueous solution of the above-described fluorinated surfactant, hydrogen fluoride and ammonium fluoride. Such solutions are particularly useful in etching of oxidized silicon due to the high $SiO_2/Si$ etch selectivity.

It is to be understood that the recitation of numerical ranges by endpoints includes all numbers and fractions subsumed within that range (e.g. 1 to 5 includes 1, 1.5, 2, 2.75, 3, 3.80, 4, and 5). It is to be understood that all numbers and fractions thereof are presumed to be modified by the term "about." It is to be understood that "a" as used herein includes both the singular and plural.

The term "alkyl" refers to straight or branched, cyclic or acyclic hydrocarbon radicals, such as methyl, ethyl, propyl, butyl, octyl, isopropyl, tert-butyl, sec-pentyl, and the like. Alkyl groups include, for example, 1 to 12 carbon atoms, 1 to 8 carbon atoms, or preferably 1 to 6 carbon atoms.

The term "aryl" refers to monovalent unsaturated aromatic carbocyclic radicals having a single ring, such as phenyl, or multiple condensed rings, such as naphthyl or anthryl.

The term "perfluoroalkyl" refers to a fully fluorinated monovalent straight or branched, cyclic or acyclic, saturated hydrocarbon radical such as, for example, $CF_3$—, $CF_3CF_2$—, $CF_3CF_2CF_2$—, $(CF_3)_2CFCF_2CF(CF_3)CF_2$—, $CF_3CF(CF_2CF_3)CF_2CF(CF_3)CF_2$—, and the like. One or more non-adjacent —$CF_2$— groups may be substituted with a catenary oxygen or nitrogen atom such as, for example, $CF_3CF_2OCF(CF_3)CF_2$—, and the like. Perfluoroalkyl groups include, for example, 1 to 12 carbon atoms, preferably 3 to 6 carbon atoms.

DETAILED DESCRIPTION

Compositions of this invention, comprising a fluorinated surfactant, and an acid such as hydrogen fluoride and/or onium fluoride complex, are useful in the various etch operations performed on substrates such as those that may be required for operations in the manufacture of semiconductors. As used herein "substrate" will refer to wafers and chips used in semiconductor manufacture, including silicon, germanium, GaAs, InP and other III–V and II–VI compound semiconductors. For silicon and $SiO_2$ substrates, the compositions can effectively convert hydrophilic silicon oxides to soluble or volatile silicon fluorides.

Other substrates, such as metals may also be etched by appropriate selection of the acid. The fluorinated surfactant effectively reduces the surface tension of the aqueous acid, allowing effective wetting of the substrate.

The etch composition and method of this invention can offer enhanced wetting, which is especially important in small geometry patterns and for features with large aspect ratios, reduced particulate contamination, and reduced surface roughness all leading to improvements in manufacturing efficiency by lowering defects to increase wafer yield, by decreasing cleaning times to increase wafer production or by allowing for longer etch bath life by reducing filtration losses of surfactant.

The improved performance is due, in part, to the low surface tension of the etch solution due to the fluorinated surfactants used, which contributes to the improved wetting of the surfaces. The surface tensions of the etch solutions are generally less than 50 dynes/cm, preferably less than 23 dynes/cm and most preferably between 15 and 20 dynes/cm when measured at 25° C.

The present invention provides an aqueous etch solution comprising an acid and a surfactant of the formula:

$$R_f\text{-}Q\text{-}R^1\text{-}SO_3^-M^+ \qquad (I)$$

wherein $R_f$ is a $C_1$ to $C_{12}$ perfluoroalkyl group, optionally containing catenary oxygen or nitrogen atoms, each $R^1$ is independently —$C_nH_{2n}(CHOH)_oC_mH_{2m}$—, wherein n and m are independently 1 to 6, and o is 0 or 1, and wherein $R^1$ optionally contains a catenary oxygen or nitrogen atom;

$M^+$ is a cation; and

Q is —O—, or —$SO_2NR^2$—, wherein $R^2$ is H, an alkyl, aryl, hydroxyalkyl, sulfonatoalkyl or aminoalkyl. Preferably, Q is —$SO_2NR^2$— wherein $R^2$ is a hydroxyalkyl or aminoalkyl.

The $R_f$ group is a perfluorinated alkyl group having from 1-12 carbon atoms, with 3 to 6 carbon atoms preferred. The $R_f$ perfluorinated alkyl groups may be unbranched, branched, or acyclic, cyclic and preferably are unbranched. Catenary heteroatoms such as divalent oxygen, trivalent nitrogen or hexavalent sulfur may interrupt the skeletal chain, (i.e. replace one or more non-adjacent —$CF_2$— groups). When $R_f$ is or contains a cyclic structure, such structure preferably has 5 or 6 ring members, 1 or 2 of which can be catenary heteroatoms. The alkylene radical $R_f$ is also free of ethylenic or other carbon-carbon unsaturation: e.g., it is a saturated aliphatic, cycloaliphatic or heterocyclic monovalent group.

The $R^2$ group of —$SO_2NR^2$— (Q group) may be an H, an alkyl, hydroxyalkyl, aminoalkyl, or a sulfonatoalkyl group of the formula —$R_1$—$SO_3$-M+. Thus, $R^2$ may be an alkyl group of the formula —$C_pH_{2p+1}$, a hydroxyalkyl group of the formula —$C_pH_{2p}$—OH, or an aminoalkyl group of the formula —$C_pH_{2p}$—$NR^3R^4$, a sulfonatoalkyl group of the formula —$C_pH_{2p}$—$SO_3^-$, where p is an integer of 1 to 12, preferably 1 to 6, and $R^3$ and $R^4$ are independently H or alkyl groups of 1 to 12 carbon atoms, preferably 1 to 6 carbon atoms.

The $R^2$ group may also comprise an aryl group having from 5 to 12 ring atoms, for example phenyl or naphthyl rings. Substituted aryl groups, such as alkyl substituted aryl groups of the formula $C_pH_{2p+1}$-(Aryl)- are also contemplated, as are arylalkylene groups of the formula —$C_pH_{2p}$-(Aryl).

The invention therefore provides etch solutions comprising fluorinated surfactants of the formula:

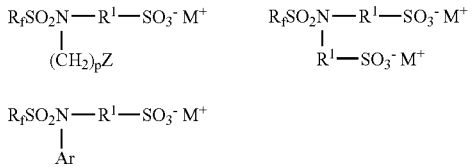

wherein $R_f$, $R^1$ and $M^+$ are as previously defined, p is 1 to 6, Ar is an aryl group, and Z is H, —OH, —$SO_3^-$, an aryl group (Ar), or —$NR^3R^4$, where $R^3$ and $R^4$ are independently H or alkyl groups of one to six carbon atoms.

Many previously known fluorinated surfactants contain perfluorooctyl moieties, such as the perfluorooctanesulfonate anion (PFOS). It has been reported that certain perfluorooctyl-containing compounds may tend to bio-accumulate in living organisms; this tendency has been cited as a potential concern regarding some fluorochemical compounds. For example, see U.S. Pat. No. 5,688,884 (Baker et al.). As a result, there is a desire for fluorine-containing surfactants which are effective in providing desired performance, and which eliminate more effectively from the body (including the tendency of the composition and its degradation products).

It is expected that the surfactants of the present invention, which contain anions with relatively short perfluoroalkyl segments (<8 perfluorinated carbon atoms), when exposed to biological, thermal, oxidative, hydrolytic, and photolytic conditions found in the environment, will break down to functional, short chain fluorocarbon degradation products that will not bio-accumulate. For example, compositions of the present invention comprising a perfluorobutyl moiety, such as $CF_3CF_2CF_2CF_2$—, are expected to eliminate from the body more effectively than perfluorohexyl- and much more effectively than perfluorooctyl-. For this reason preferred embodiments of the Rf group in Formula I include perfluoroalkyl groups, $C_mF_{2m+1}$— containing a total of 3 to 6 carbon atoms.

With respect to $R^1$, the indicated alkylene group may further contain a catenary (i.e. in chain) oxygen or nitrogen group whereby a —$CH_2$— group is replaced by —O— or —$NR^5$—, wherein $R^5$ is an H—, or a $C_1$ to $C_6$ alkyl group. If desired, the catenary nitrogen group may be a quaternary amine group of the formula —$N(R^5)_2^+$—, where each $R^5$ group is independently an alkyl group of 1 to 6 carbons. Useful catenary amine groups may include, for example —NH—, —$N(CH_3)$—, —$N(C_3H_6)$—, —$N(CH_3)_2^+$—, —$N(CH_3)(C_4H_9)^+$— and the like. Thus, the catenary amine group may comprise an in-chain secondary, tertiary or quaternary nitrogen atom. It is preferred that such catenary atoms are not alpha to a —(CHOH)— group, if present and are not alpha to a heteroatom, such as is found in the Q group and —$SO_3^-$ group of Formula I.

With respect to Formula I, $M^+$ represent an inorganic or organic cation. Suitable inorganic cations include metal cations, including transition metal cations, alkali- and alkaline earth metal cations and ammonium cations such as $NH_4^+$. Suitable organic cations include onium cations such as ammonium, including primary, secondary, tertiary and quaternary ammonium cations, as well as sulfonium, and phosphonium cations. For many etching applications, such as in the preparing of semiconductors, metals may have a deleterious effect on the subsequent electronic performance of the devices and for this reason, ammonium cations, especially $NH_4^+$ and quaternary ammonium cations are preferred.

In general, materials of the invention are prepared by first generating an anion from the appropriate fluorochemical moiety in a polar solvent. The anion is typically generated in-situ by reaction of the appropriate fluorochemical moiety with either a strong base, or a fluoride ion. For example, where Q is —O—, a fluoroalkoxide anion of the formula $R_f$—O— is generated by treating the corresponding acid fluoride ($R_f$—CO—F) with fluoride ion. Alternatively, where Q is —$SO_2NR^2$—, a sulfonamide salt may be generated by reacting a compound of the formula $R_fSO_2NR^2H$ with strong base to form a nitrogen-centered anion of the formula $R_fSO_2N^-R^2$. These anions may be further reacted with an electrophile containing either a sulfonate group, or containing a nascent sulfonate group (i.e. a sultone) resulting in compositions of the invention. Further details regarding the preparation of compounds of Formula I may be made with reference to the examples.

The HF may be aqueous HF per se (i.e. diluted 49% HF), or may be used in the form of an onium fluoride complex. Such complexes, known as "onium poly(hydrogen fluorides)" have the general formula $BH^+(HF)_xF^-$, where B is an electron-pair donor base and x is an integer generally from 1 to 10, and include oxonium-, ammonium-, pyridinium-, and phosphonium-poly(hydrogen fluorides). Such onium complexes are less volatile, less corrosive, and are normally liquids at room temperatures. Many such onium complexes are stable liquids that resist the loss of HF even during distillation. Further information regarding useful onium complexes may be found in *Synthetic Fluorine Chemistry*, George A. Olah, et al., editors, "Fluorination with Onium Poly(hydrogen fluorides): the taming of anhydrous hydrogen fluoride for synthesis", John Wiley and Sons, New York, N.Y., pp. 163–204.

The HF useful in compositions and processes of this invention, whether aqueous HF or an aqueous onium complex, is preferably substantially free of other contaminants such as metals, particulates and non-volatile residues in order to effectively etch the silicon surface at the maximum rate during the manufacturing process and not leave residues.

The etch solution may be prepared by combining, in any order, the acid (the aqueous hydrogen fluoride and/or the onium fluoride complex in the case of silicon substrates) and the fluorinated surfactant. For oxidized silicon substrates, the concentration of hydrogen fluoride may vary widely, i.e. from 0.1 to 49 wt. %, depending on the substrate and the etch rate desired. Generally, the concentration of HF is form about 0.1 to 10 wt. %. If an onium fluoride complex, such as ammonium fluoride, is substituted for all or part of the HF, the amount of the onium fluoride may be determined by the HF acid equivalent.

If desired, the etch solution may further comprise an organic solvent. In many instances the use of an organic solvent may improve the performance, particularly the post-filtration performance, of the etch solution by improving the solubility of the fluorinated surfactant in the aqueous HF solution. It is believed that organic solvents may advantageously lower the critical micelle concentration of the surfactant. Useful organic solvents may include polar solvents such as ethers, such as diethyl ether or tetrahydrofuran, polyethers such as glymes, alcohols, esters, dimethylformamide, acetonitrile, acetone, dimethylsulfoxide and carbonates. Solvent selection may be made by reference to Shah, et al., *Semiconductor International*, October 1988.

If desired, the etch solution may further comprise a second surfactant, in addition to the surfactant of Formula I. Such second surfactants include both fluorinated and non-fluorinated surfactants such as are known in the etching art. Reference may be made to Kikuyama et al., IEEE Transactions on Semiconductor Manufacturing, Vol. 3, 1990, pp 99–108, incorporated herein by reference. Generally, the second surfactant may comprise 0 to 80 weight % of the total surfactant; the total amount of first and second surfactants comprising 10 to 1000 parts per million.

A particularly useful class of second surfactants is perfluoroalkylsulfonamido salts, including those of the formula:

$$R_f—SO_2N^-—R^6-M^+ \qquad (II)$$

wherein $R_f$ is a $C_1$ to $C_{12}$ perfluoroalkyl group as previously described for the surfactants of Formula I, $R^6$ is H, an alkyl group, an aryl group, a hydroxyalkyl group or an aminoalkyl group each having one to six carbon atoms, or an aryl group having 6 to 12 ring atoms, and $M^+$ is a cation. Preferably, $R^6$ is H or a hydroxyalkyl group, and preferably $M^+$ represents an ammonium cation, including $NH_4^+$, and primary, secondary, tertiary and quaternary ammonium cations. Etch solutions containing mixtures of the fluorinated surfactant of Formula I and perfluoroalkylsulfonamido salts have been found to provide lower surface tension solutions than can be achieved using either surfactant alone. Fluorochemical sulfonamides corresponding to Formula II may be prepared as described in U.S. Pat. No. 4,370,254 (Mitschke et al.).

The invention provides a process for etching a substrate by contacting the substrate with the etch solution of the invention for a time and at a temperature sufficient to effect the desired degree of etching. Preferably, the substrate is an oxidized silicon substrate and the etch solution is a buffered oxide etch solution as described herein. Normally an oxidized silicon substrate is etched at 15 to 40° C. If desired, the etch process may further comprise the step of rinsing the etch solution from the etched substrate. In one embodiment, the solution may be rinsed with water, and preferably deionized water. In another embodiment, the etch solution is slowly replaced with deionized water in a gradient etch process.

The etch process may further including a drying step whereby the rinse solution is removed from the surface of the etched substrate such as by the application or heat, forced air, immersion in a solvent bath, such as an alcohol bath, or immersion is the heated vapors of a solvent such as an alcohol.

For the etching of $SiO_2$ substrates, a mixture of HF and an onium fluoride complex is preferred to stabilize the solution and to reduce the variation in the amount of free HF. Such buffered oxide etch solutions may comprise 0.1 to 10 weight % HF and 20 to 40 weight % of ammonium fluoride. Such solutions will generally have pH values of from 2 to 7.5.

The surfactant is used in amounts sufficient to reduce the surface tension of the solution to the desired degree. For wet etching of silicon substrates, the surfactant is generally used in amounts sufficient to reduce the surface tension of the resulting solution to 50 dynes/cm or less, preferably 23 dynes/cm or less. Generally the solution comprises 10 to 1000 parts per million of surfactant, and is preferably 100 to 500 parts per million. Below 10 parts per million the solution may not exhibit the desirable reduced surface tension and large contact angle on silicon substrate. Above 1000 parts per million, there is little improvement in the properties of the solution or the performance in etching.

The buffered oxide etch solution comprising an aqueous solution of fluorinated surfactant, hydrogen fluoride and onium fluoride, preferably ammonium fluoride, may be used to etch the surface of a silicon wafer. In particular, the solution may be used to etch a $SiO_2$ surface having a resist mask. Conventional buffered oxide etch solutions often failed to wet, and subsequently etch, fine features of such devices leading to defects.

BOE etchants are used in standard oxide etch processes in the IC and MEMS manufacture. While the isotropic etching behavior of BOE can limit its utility, the high selectivity for etching of silicon oxide ($SiO_2$) over silicon (Si) is a tremendous advantage over dry etching processes, such as reactive ion etch (RIE). Conventional BOE solutions fail to fully flow into the small contact holes and some of the oxide remains, thereby creating defects.

Other substrates may also be etched by appropriate selection of the acid or acid mixture. Gold, indium, molybdenum, platinum and nichrome substrates may be etched with a mixture of hydrochloric and nitric acids. Aluminum substrates may be etched with a mixture of phosphoric and nitric acids, and may optionally include acetic acid as a buffer. Silicon substrates may be etched with a mixture of hydrofluoric, nitric and acetic acids. In general, the fluorinated surfactant is used in amounts described for the buffered oxide etch previously described. A SIRTL etch solution may be prepared using a mixture of chromium trioxide and hydrofluoric acid to determine defects in single crystal silicon.

The objects, features and advantages of the present invention are further illustrated by the following examples, but the particular materials and amounts thereof recited in these examples, as well as other conditions and details, should not be construed to unduly limit this invention. All materials are commercially available or known to those skilled in the art unless otherwise stated or apparent.

EXAMPLES

| Descriptor | Description/Structure and or Formula | Availability |
|---|---|---|
| Adogen ™ 464 | methyltrialkyl(C8–C10) ammonium chloride | Sigma-Aldrich Milwaukee, WI |
| CHPS | 3-chloro-2-hydroxy-1-propanesulfonate sodium salt; $ClCH_2CH(OH)CH_2SO_3Na \cdot H_2O$ | Sigma-Aldrich |
| DMAPA | dimethylaminopropylamine; $H_2N(CH_2)_3N(CH_3)_2$ | Sigma-Aldrich |
| Aniline | $NH_2C_6H_5$ | Sigma-Aldrich |
| DME | dimethoxyethane; $CH_3OCH_2CH_2OCH_3$ | Sigma-Aldrich |
| Forfac ™ 1033D | $(C_6F_{13}CH_2CH_2SO_3H)$ | Atofina Chemicals, Philadelphia, PA |
| FC-23 | FLUORAD ™ FC-23; $C_3F_7CO_2H$ | 3M Company, St. Paul, MN |
| Hexane | $CH_3(CH_2)_4CH_3$ | Sigma-Aldrich |
| MTBE | methyl-t-butyl ether; $CH_3OC(CH_3)_3$ | Sigma-Aldrich |
| n-octylamine | $CH_3(CH_2)_7NH_2$ | Sigma-Aldrich |
| triethylamine | $N(C_2H_5)_3$ | Sigma-Aldrich |
| PBSF | perfluorobutanesulfonyl fluoride; $C_4F_9SO_2F$ | Sigma-Aldrich |

-continued

| Descriptor | Description/Structure and or Formula | Availability |
|---|---|---|
| 1,4-butane sultone | [structure of 1,4-butane sultone] | Sigma-Aldrich |
| 1,3-propane sultone | [structure of 1,3-propane sultone] | Sigma-Aldrich |

$C_4F_9SO_2NH(CH_2)_3N(CH_3)_2$ can be prepared essentially according to U.S. Pat. No. 5,085,786 (Alm et al.) replacing $C_6F_{13}SO_2F$ with $C4F_9SO_2F$.

$C_4F_9SO_2NH(C_2H_5)$ can be prepared essentially according to WO 01/30873 A1, Example 1A, replacing $NH_2CH_3$ with an equimolar amount of $NH_2C_2H_5$.

FC-17 can be prepared essentially according to WO 01/30873 A1 Example 1.

Test Methods

Test Procedure 1—Surface Tension Determination

All surface tensions were determined using a Kruss K12 Tensiometer. The program was run using a Wilhelmy platinum plate (PL12) and plastic sample vessel (HDPE). All parts referenced above, except for the plastic sample vessel, but including instrument and computer are available from Kruss USA, Charlotte, N.C.

Preparation of FC-1; $C_4F_9SO_2N(C_2H_5)C_3H_6SO_3Li$

A 500 mL round bottom flask equipped with a condenser, heating mantle and stirrer was charged with $C_4F_9SO_2NH(C_2H_5)$ (15.0 g, 0.0458 moles), LiOH $H_2O$ (2.1 g; 0.05 moles) and MTBE (100 mL). The ensuing mixture was heated at reflux temperature, with stirring for 1.5 hours. After cooling to room temperature, the mixture was filtered. The clear, colorless filtrate was combined with 1,3-propane sultone (6.12 g; 0.05 moles) and heated to about 50° C. for 1.5 hours causing precipitation of a white solid. After cooling to room temperature, the white solid was isolated by filtration of the MTBE suspension by suction through a sintered glass frit and washing of the precipitate with two 150 mL portions of MTBE to remove possible residual soluble starting materials. The solid was dried partially by suction and then further dried in a vacuum oven at 50–60° C., $10^{-2}$ torr for about one hour. A white crystalline solid was obtained (13.75 g; 66% yield). The $^1H$ NMR spectrum recorded at 200 MHz in $d_6$-acetone was consistent with the structure of $C_4F_9SO_2N(C_2H_5)C_3H_6SO_3Li$.

Preparation of Intermediate $C_4F_9SO_2NH_2$

A 3-necked round bottom flask fitted with a cold finger condenser (−78° C.), an overhead stirrer, thermocouple and a plastic tube for gas addition was charged with perfluorobutanesulfonyl fluoride (PBSF; 500.0 g; 1.6 moles; available from 3M Company, St Paul, Minn.), isopropyl ether (600 mL; available from Sigma-Aldrich) and placed in a bath of room temperature water. Ammonia gas (90.0 g; 5.3 mole) was added through the tube over a period of 3 hours at a rate such that dripping off the −78° C. condenser was not observable. The final temperature of the mixture was 13° C.

The mixture was allowed to stir overnight with warming to room temperature, then the solvent was distilled at atmospheric pressure. When the pot temperature reached 95° C., the temperature setpoint was lowered to 74° C. and deionized water added (400 mL) followed by sulfuric acid (100 g conc; 95%) at a rate to maintain the temperature below 85° C. The batch was stirred for about 15 minutes then the upper aqueous phase was removed. The resulting solids were washed with aqueous sulfuric acid (50.0 g; conc; 95% in 400 mL water), then with deionized water (500 mL).

The mixture was heated and solvent removed under vacuum with water flowing through the condenser until the batch temperture reached 75° C. The solid was isolated by distillation at 12 torr and temperature of 120° C. to 160° C. 454 g of white to creme colored solid, $C_4F_9SO_2NH_2$ (96% yield) was obtained.

Preparation of Intermediate $C4F_9SO_2NH(C_2H_1OH)$

A 5 L round bottom flask equipped with an overhead stirrer, thermocouple, and reflux condenser was charged with $C_4F_9SO_2NH_2$ (2000.0 g; 6.69 moles), ethylene carbonate (245 g; 2.78 moles), and sodium carbonate (48.5 g; 0.45 moles; $Na_2CO_3$). The mixture was heated, with stirring, at 120° C. for one hour. More ethylene carbonate (154 g; 1.75 moles) was added and the mixture was heated for an additional 1.5 hours. After additional ethylene carbonate (154 g; 1.75 moles) was added the batch was then heated for an additional 4.5 hours. The mixture was cooled to 89° C., and deionized water (1000 mL) was added, followed by sulfuric acid (56 g; concentrated). The batch was agitated for 30 minutes and stirring was discontinued, allowing separation into two phases.

The upper aqueous phase layer was removed by vacuum aspiration and deionized water (1000 mL) was added to the remaining organic layer and the mixtures was stirred at 89° C. for an additional 30 minutes. The reaction mixtures was poured into a separatory funnel and the lower organic phase was separated from the upper aqueous phase to yield 2163 g of crude $C_4F_9SO_2NH(C_2H_{40}H)$.

GC analysis indicated that the crude material contained 66% of the desired material. Crude $C_4F_9SO_2NH(C_2H_{40}H)$ was placed in a three-liter flask equipped with an overhead stirrer, thermocouple, vacuum gauge, and a six plate sieve tray distillation column along with associated distillation head and receiver. Water was removed under reduced pressure until the pot temperature reached 87° C. (@ 29 mm Hg), followed by fractional distillation. High purity $C_4F_9SO_2NH(C_2H_{40}H)$ (greater than 95% gc assay) was collected at head temperatures of 120–134° C., pot temperatures of 156–170° C., and vacuum of 4–9 mm Hg; A total of 1075 g was isolated (correcting for % conversion, the yield was 74%).

Preparation of FC-2; $C_4F_9SO_2N(C_2H_1OH)C_3H_6SO_3Li$ $C_4F_9SO_2N(C_2H_1OH)C_3H_6SO_3Li$ was prepared essentially according to the procedure described in Preparation 1 with the exception that $C_4F_9SO_2NH(C_2H_5)$ was replaced with $C_4F_9SO_2NH(C_2H_4OH)$ (4.2 g; 0.012 moles; as prepared above), and the corresponding amounts of the following were used: LiOH—$H_2O$ (0.56 g; 0.013 moles), MTBE (50 mL) and 1,3-propanesultone (1.64 g; 0.013 moles). A white crystalline solid was isolated (3.39 g; 58.9% yield).

Preparation of FC-3; $C_4F_9SO_2N(C_2H_4OH)C_4H_8SO_3Li$ $C_4F_9SO_2N(C_2H_4OH)C_4H_8SO_3Li$ was prepared essentially according to the procedure described in Preparation 1 with the exception that the corresponding amounts of the following were used: using $C4F_9SO_2NH(C_2H_4OH)$ (4.2 g; 0.012 moles; as prepared above), LiOH $H_2O$ (0.565 g; 0.013 moles), MTBE(50 mL), and (75 mL), and 1,3-propane sultone was replaced with 1,4-butanesultone (1.83 g; 0.013 moles). Additionally, after evaporating most of MTBE by boiling at atmospheric pressure, DME was added and reflux was resumed at 85° C. for 1 hour resulting in precipitation of a white solid. The white solid was isolated (1.39 g; 23.5% yield).

Preparation of FC-4; $C_4F_9SO_2N(H)C_4H_8SO_3Li$ $C_4F_9SO_2N(H)C_4H_8SO_3Li$ was prepared essentially according to the procedure described in Preparation 3 replacing $C_4F_9SO_2NH(C_2H_4OH)$ with $C_4F_9SO_2NH_2$ (15.0 g; 0.05 moles), and the corresponding amounts of the following were used: LiOH—$H_2O$ (2.32 g; 0.055 moles), MTBE (100 mL), DME (100 mL), and 1,4-butanesultone (7.5 g; 0.055 moles). A waxy white solid was isolated (1.57 g; 7% yield).

Preparation of FC-5; $C_4F_9SO_2N(H)(CH_2)_3N^+(CH_3)_2(CH_2)_3SO_3$

A 500 mL round bottom flask fitted with a condenser, heating mantle and stirrer under nitrogen atmosphere was charged with $C_4F_9SO_2NH(CH_2)_3N(CH_3)_2$ (15.0 g, 0.039 moles), 1,3-propanesultone (5.25 g; 0.042 moles) and MTBE (100 mL) The mixture was held at reflux temperature with stirring for 27 hours. After cooling to room temperature, the insoluble solid white product was isolated by filtration of the MTBE suspension by suction through a sintered glass frit and washing of the precipitate with three 100 mL portions of MTBE. The solid was dried partially by suction and then further dried in a vacuum oven at 50–80° C., $10^{-2}$ Torr for about 45 minutes. A white solid was isolated (18.36 g; 93% yield).

Preparation of FC-6; $C_4F_9SO_2NH(CH_2)_3N(CH_3)_2$

A three-necked 2-liter round bottom flask equipped with an overhead stirrer, heating mantle, thermocouple, addition funnel, and reflux condenser, was charged with DMAPA (642 g; 6.29 moles) and hexane (2000 g). With agitation, 992 g of fractionated PBSF (992 g; 3.28 moles; fractionated 99% assay) was added over a period of one hour. The batch was stirred at 50° C. for another 2 hours, then a Dean-stark trap was inserted between the flask and the condenser. Water was added portion-wise and the hexane removed by distillation. The flask was cooled to 21° C. and the batch allowed to settle for 15 minutes. The liquid portion was removed using a 10 cm, 70 micron porous polyethylene rod (1.3 cm diameter), under vacuum. After washing twice with 2000 g of water, a wet, white solid cake was isolated and allowed to dry at room temperature overnight, followed by 3 hours at 90° C. A white solid was isolated: $(C_4F_9SO_2NH(CH_2)_3N(CH_3)_2$, 1155 g; 91%).

Preparation of FC-7; $C_4F_9SO_2N[CH_2CH(OH)CH_2SO_3Na](CH_2)_3N(CH_3)_2$

A 1 L round bottom flask fitted with a heating mantle and condenser was charged with $C_4F_9SO_2NH(CH_2)_3N(CH_3)_2$ (119.0 g; 0.31 moles), CHPS (62.5 g; 0.32 moles), NaOH (13.3 g; 0.34 moles; pellets) and deionized water (250 mL). The flask was heated at 95° C. overnight, resulting in a solid shown to be:

$C_4F_9SO_2N[CH_2CH(OH)CH_2SO_3Na](CH_2)_3N(CH_3)_2$

Preparation of FC-8; $C_4F_9SO_2N[CH_2CH(OH)CH_2SO_3Na](CH_2)_3N+[CH_2C](CH_3)_2$ The procedure described for Preparation of FC-7 was essentially followed, substituting the following amounts of materials: $C_4F_9SO_2NH(CH_2)_3N(CH_3)_2$ (59.5 g; 0.16 moles), CHPS (62.5 g; 0.32 moles), NaOH pellets (13.3 g; 0.34 moles) and deionized water (250 mL), resulting in a solid shown to be the above salt.

Preparation of FC-9; $C_4F_9SO_2N(Me)CH_2CH(OH)CH_2SO_3Na$

The procedure described for Preparation of FC-7 was essentially followed, substituting the following amounts of materials: $C_4F_9SO_2NHMe$ (90.8 g; 0.29 moles), CHPS (62.5 g; 0.32 moles), NaOH pellets (12.5 g; 0.30 moles) and deionized water (100 mL), resulting in a white solid shown to be: $C_4F_9SO_2N(Me)CH_2CH(OH)CH_2SO_3Na$.

Preparation of FC-10; $C_4F_9SO_2N(Et)CH_2CH(OH)CH_2SO_3Na$

A one liter flask equipped with an overhead stirrer, thermocouple, reflux condenser and heating mantle was charged with $C_4F_9SO_2NHEt$ (92.0 g; 0.28 moles), NaOH pellets (0.14 g; 0.35 moles) and deionized water (90 mL) and held at 98° C. for 5 hours. The batch was cooled to 76° C. and CHPS (69.0 g 0.35 moles), and deionized water (20 mL) were added. The batch temperature was increased to 100° C. and maintained for 18 hours. The set point was lowered to 90° C. and deionized water (150 mL) was added. The batch was allowed to cool with stirring to 40° C. A white solid had formed in the bottom of the flask, and stirring was stopped and the solid was allowed to settle.

When the batch temperature reached 30° C., the upper liquid was decanted from the white solid. Deionized water (250 mL) was added and the batch was heated to 50° C. The flask was cooled to 19° C. and allowed to settle. The upper liquid layer was decanted from the white solid on the bottom of the flask. Deionized water (200 mL) was added and the batch was slurried at room temperature, and then filtered. The cake of white solid was washed with deionized water (100 mL), then dried to give $C_4F_9SO_2N(Et)CH_2CH(OH)CH_2SO_3Na$ (119 g; 88% yield). NMR, gc/ms and lc/ms of an aliquot that had been acidified and treated with diazomethane were consistent with the desired structure.

Preparation of FC-11; n-$C_4F_9OC_4H_8SO_3K$

A 600 mL Parr stainless steel reactor, available from Parr, Chicago, Ill., was charged with diglyme (130 g), Adogen™ 464 (8.0 g), KF (38 g; 0.65 moles), n-perfluorobutyryl fluoride (130 g; 0.440 moles; 90% purity), and butane sultone (100 g; 0.73 moles). The reactor was heated to 75° C. for 70 hours. The mixture was cooled, treated with 45% KOH and precipitated with toluene. Structure of the resulting solid, n-$C_4F_9OC_4H_8SO_3K$ (184 g, 92% purity), was confirmed using $^{13}C$- and $^1H$-nmr analyses.

Preparation of FC-12; i-$C_4F_9OC_4H_8SO_3K$

The method described in Preparation 11 was essentially followed, substituting the following charges: diglyme (110.0 g), Adogen™ 464 (7.0 g), KF (35.0 g; 0.60 moles), butane sultone (73.0 g; 0.54 moles) and replacing n-perfluorobutyryl fluoride with iso-perfluorobutyryl fluoride (175.0 g; 0.461 moles 70% purity). Structure of the resulting solid, i-$C_4F_9OC_4H_8SO_3K$, was confirmed using $^{13}C$- and $^1H$-mm analyses.

Preparation of FC-13; n-$C_4F_9OC_3H_6SO_3K$

The method described in Preparation 11 was essentially followed substituting the following charges: n-perfluorobutyryl fluoride (166.0 g; 0.562 moles; 90% purity), diglyme (150.0 g), Adogen™ 464 (9.0 g), 35 g KF (47.0 g; 0.81 moles), and replacing butane sultone with propane sultone (81.0 g; 0.66 moles). Structure of the resulting solid, n-$C_4F_9OC_3H_6SO_3K$, was confirmed using $^{13}C$- and $^1H$-nmr analyses.

Preparation of FC-14; $C_4F_9SO_2N(C_2H_4OH)CH_2CH(OH)CH_2SO_3Na/C_4F_9SO_2NH(C_2H_4OH)$ Mixture A 500 mL round bottom flask equipped with a condenser, heating mantle and stirrer was charged with $C_4F_9SO_2NH(C_2H_4OH)$ (9.05 g, 26.4 mmole; as prepared above) sodium hydroxide (1.1 g, 27.5 mmole) and deionized water (83.8 g) to form a clear homogeneous solution. CHPS (5.7 g, 29.0 mmole) was added in one portion and the ensuing mixture heated to 95° C. with stirring under a nitrogen atmosphere for 16 hours.

The resulting tan, viscous solution was cooled to room temperature and additional water added to make a mixture of about 10% solids by weight. The structure of the product was confirmed by negative electrospray lc/ms which identified two primary components: $C_4F_9SO_2NH(C_2H_4OH)$ (as the sodium salt, m/e=342) and $C_4F_9SO_2N(C_2H_4OH)CH_2CH(OH)CH_2SO_3Na$ (m/e=480). Further quantitative analysis showed that 53% of the $C_4F_9SO_2NHC_2H_4OH$ remained.

Preparation of FC-15; $C_4F_9SO_2N(-)CH_2CH_2OH$ $(K^+)$ $C_4F_9SO_2NH$ $CH_2CH_2OH$ (20.1 g; 0.059 moles; as prepared above), KOH (3.9 g; 0.059 mole; 85%) and deionized water (66.0 g) were stirred at room temperature for 30 minutes until a relatively homogenous solution was formed. The pH was 12–13. The solution was filtered to give 89 g of 25.3% solids aqueous solution of $C_4F_9SO_2N(-)CH_2CH_2OH+K$.

Preparation of FC-16; $C_4F_9SO_2N(C_2H_4OH)CH_2CH(OH)CH_2SO_3Na$

A 1 L round bottom flask fitted with a mechanical stirrer, condenser, thermocouple and heating mantle was charged with $C_4F_9SO_2NH(CH_2CH_2OH)$ (77.6 g; 0.226 moles), CHPS (56.0 g; 0.28 mole) and deionized water (80 mL). The mixture was heated at 98° C. for 5 hours, cooled to 76° C. and NaOH was added (11.3 g; 0.28 moles). The batch temperature was increased to 100° C. and maintained for 18 hours. The temperature was then lowered to 90° C. and a mixture of water/acetone (75 g/120 g) was added. The batch was allowed to cool with stirring to 40° C., then poured out into a glass pan and dried at 50-60° C. overnight. The pan contained an off-white solid (133 g) determined to be $C_4F_9SO_2N(C_2H_4OH)CH_2CH(OH)CH_2SO_3Na$. Structure was confirmed using standard lc/ms techniques.

Preparation of FC-18; $C_4F_9SO_2NHC_6H_5$

A 600 ml steel autoclave equipped with a paddle stirrer was charged with aniline (18.6 g; 0.2 mole), triethylamine (60.0 g; 0.6 mol) and PBSF (68.4 g; 0.23 mol). The ensuing mixture was stirred and heated at 120° C. for about 5 hr. The cooled reactor contents were mixed with NaOH (70 g; 50% aq) and warmed to about 50° C. for a few hours. The mixture was then acidified with sulfuric acid (50%) and the resulting dark oil extracted into methylene chloride. The solvent was evaporated and the residual 50.4 g was distilled to yield a tan, waxy solid (30.2 g; b.p. 95–110° C./0.15 mm Hg (20 Pa)). Recrystallization from hexane gave light tan crystals, mp 60–63° C.

Preparation of $C_4F_9SO_2N(C_3H_7)CH_2CH(OH)CH_2SO_3Na$ (FC-19)

A 1 L 3-necked round bottom flask equipped with a condenser, mechanical stirrer, thermocouple and addition funnel was charged with perfluorobutanesulfonyl fluoride (100.0 g; 0.33 moles). n-Propyl amine (40.0 g; 0.68 mole) was then added over a period of 30 minutes. The ensuing mixture was refluxed at 72° C. for 2 hours at which time water (300 mL) was slowly added. The batch was stirred for about 15 minutes and the upper aqueous phase was removed an discarded. The remaining material was then successively washed with 5% sufuric acid (300 mL; 5%; aq) and water (300 mL). The viscous yellow liquid recovered was shown to be $C_4F_9SO_2NHC_3H_7$ (99 g).

A 1 L 3-necked round bottom flask equipped with a mechanical stirrer, thermocouple, reflux condenser and heating mantle was charged with $C_4F_9SO_2NHC_3H_7$ (93.6 g; 0.27 moles; as prepared above), NaOH (13.6 g; 0.35 moles; pellets) and water (90 mL) and heated at 98° C. for 45 minutes. Upon cooling to 76° C., CHPS (67.5 g; 0.34 moles) was added and the temperature was then increased to 100° C. and maintained for 18 hours. Water was then added (250 mL) and a viscous yellow liquid formed in the bottom of the flask. The upper liquid phase was decanted off and discarded leaving a thick yellow liquid, to which water (250 mL) was added. The temperature of the mixture was increased to 50° C., then cooled to 19° C. Upon removal of water a creme colored solid remained, $C_4F_9SO_2N(C_3H_7)CH_2CH(OH)CH_2SO_3Na$ (111.4 g; 81% yield).

The surface tension at a 0.2 wt. % in 85% phosphoric acid was 19.4 dynes/cm.

Preparation of Buffered Oxide Etch Examples and Comparative Examples

A premix of each surfactant was made to facilitate the addition of the surfactant to the 500:1 BOE solution. Premixes nominally contained 2% surfactant by wt. in water alone, a mixture of isopropanol/deionized water (3:1 by wt.), or a mixture of water, isopropanol/n-butanol/deionized water (5.4:1.7:1 by wt.). Table 1. The fluorochemical premix was added to a buffered oxide etch solution (BOE 500:1 Buffered oxide etch solution; available from Ashland Chemical, Dublin, Ohio) in an amount such that the resulting surfactant concentration was 500 ppm, unless otherwise noted in Table 1.

Surface tension measurements were then made on the unfiltered and filtered solutions (Vacuum Filter/Storage Systems, Sterile 0.22 micron PES Membrane, 50 mm filter diameter, 250 mL Receiver cap; available from Corning, Corning, N.Y.) according to Test Procedure I: Surface Tension Determination described above.

TABLE 1

Surface tension values (dyne/cm) for 500:1 BOE solutions containing various surfactants at given concentrations.

| Example | Fluorochemical | Premix Solvent | Surface Tension in dyne/cm (post-filtration) |
|---|---|---|---|
| C1 | none added | none added | 93.0 (93.0) |
| C2 | FC-23 | DI Water | 66.3 (66.9) |
| C3 | FC-17 | DI Water | 39.2 (73.6) |
| C4 | n-octylamine (@ 1000 ppm) | DI Water | 22.7 (22.9) |
| C5 | Forfac ™ 1033D | DI Water | 45.6 (84.7) |
| C6 | CHPS | DI Water | 91.8 (—) |
| 1 | FC-1 | IPA/DI Water | 28.7 (57.4) |
| 2 | FC-1 | DI Water | 24.6 (90.0) |
| 3 | FC-1 | IPA/n-butanol/DI Water | 25.8 (20.0) |
| 4 | FC-2 | DI Water | 46.4 (90.7) |
| 5 | FC-3 | DI Water | 29.6 (89.3) |
| 6 | FC-4 | DI Water | 29.4 (29.5) |
| 7 | FC-5 | DI Water | 21.9 (29.8) |
| 8 | FC-8 | IPA/n-butanol/DI Water | 19.5 (22.0) |
| 9 | FC-8 | DI Water | 19.2 (24.0) |
| 10 | FC-10 | DI Water | 17.7 (18.2) |
| 11 | FC-11 | DI Water | 17.3 (17.6) |
| 12 | FC-13 | DI Water | 17.4 (18.0) |
| 13 | FC-10 | IPA/n-butanol/DI Water | 18.0 (17.4) |

TABLE 1-continued

Surface tension values (dyne/cm) for 500:1 BOE solutions containing various surfactants at given concentrations.

| Example | Fluorochemical | Premix Solvent | Surface Tension in dyne/cm (post-filtration) |
|---|---|---|---|
| 14 | FC-14 | DI Water | 17.1 (17.2) |
| 15 | FC-10/FC-15 (1:1 by wt) | DI Water | 17.4 (17.8) |
| 16 | FC-16 | DI Water | 26.3 (53.4) |
| 17 | FC-18 | DI Water | 27.4 (35.8) |

Preparation of Surfactant Solutions in Various Solvents

Solutions of surfactants (0.2% by wt) were prepared by the dissolution of appropriate amounts of surfactant in the solvent listed in Table 2. Surface tension measurements were then made on the unfiltered solution according to Test Procedure I: Surface Tension Determination described above. Results are listed in Table 2.

TABLE 2

| | | Surface Tension (dynes/cm) for additive at 0.2% in solvent | | | | |
|---|---|---|---|---|---|---|
| Example | Solvent | FC-10 | FC-14 | FC-11 | FC-7 | FC-8 |
| C7 | DI water | 30 | 24 | 24 | 42 | 24 |
| 18 | HCl (18.5%) | 18 | 19 | 19 | 33 | 20 |
| 19 | HNO$_3$ (40%) | 28 | 30 | 27 | 44 | 28 |
| 20 | H$_2$SO$_4$ (50%) | 18 | 17 | 18 | 33 | 21 |
| 21 | H$_3$PO$_4$ 85% | 19 | 24 | 20 | * | * |

* not measured

We claim:

1. A method of cleaning and/or etching comprising contacting a substrate with an aqueous etch solution comprising:
   a) an acid, and
   b) a surfactant of the formula:

$R_f\text{-}Q\text{-}R^1\text{—}SO_3^-M^+$ 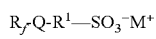

wherein
   $R_f$ is a $C_1$ to $C_{12}$ perfluoroalkyl group,
   $R^1$ is an alkylene of the formula —$C_nH_{2n}(CHOH)_o C_mH_{2m}$—, wherein n and m are independently 1 to 6, and o is 0 or 1, and is optionally substituted by a catenary oxygen or nitrogen group;
   $M^+$ is a cation; and
   Q is —O—, or —SO$_2$NR$^2$—, wherein R$^2$ is an H—, alkyl, aryl, hydroxyalkyl, aminoalkyl, or sulfonatoalkyl group, optionally containing one or more catenary oxygen or nitrogen heteroatoms.

2. The method of claim 1 wherein said alkyl, hydroxyalkyl, sulfonatoalkyl or aminoalkyl groups of said —SO$_2$NR$^2$— group have from 1 to 6 carbon atoms.

3. The method of claim 1 wherein said hydroxyalkyl group is of the formula —C$_p$H$_{2p}$—OH, where p is an integer of 1 to 6.

4. The method of claim 1 wherein said aminoalkyl group is of the formula —C$_p$H$_{2p}$—NR$^3$R$^4$ where p is an integer of 1 to 6 and R$^3$ and R$^4$ are independently H or alkyl groups of one to six carbon atoms.

5. The method of claim 1 wherein said acid is HF or an onium fluoride complex.

6. The etch solution of claim 5 wherein said hydrogen fluoride complex is selected from pyridinium poly(hydrogen fluoride), oxonium poly(hydrogen fluoride), ammonium poly(hydrogen fluoride), and phosphonium poly(hydrogen fluoride).

7. The method of claim 1 wherein $R_f$ is a $C_3$ to $C_6$ perfluoroalkyl group.

8. The method of claim 1 wherein said R$^1$ group is —C$_n$H$_{2n}$CH(OH)C$_m$H$_{2m}$—, wherein n and m are independently 1 to 6.

9. The method of claim 1 comprising 10 to 1000 parts per million of said surfactant.

10. The method of claim 1 comprising 100 to 500 parts per million of said surfactant.

11. The method of claim 1 comprising 0.1 to 49 weight percent HF or onium fluoride complex thereof.

12. The method of claim 1 further comprising a perfluoroalkylsulfonamido salt.

13. The method of claim 12 wherein said perfluoroalkylsulfonamido salt is of the formula:

$R_f\text{—}SO_2N^-\text{—}R^6\text{—}M^+$ 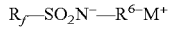

wherein $R_f$ is a $C_1$ to $C_{12}$ perfluoroalkyl group,
R$^6$ is H, an alkyl group, a hydroxyalkyl group or an aminoalkyl group, and M+ is a cation.

14. The method of claim 1 comprising 0.1 to 10 weight % HF and 20 to 40 weight % of ammonium fluoride.

15. The method of claim 1 comprising surfactants of the formula:

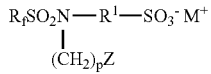

wherein $R_f$, R$^1$ and M$^+$ are as defined in claim 1, p is 1 to 6, and Z is H, aryl, —OH, —SO$_3$ or —NR$^3$R$^4$, where R$^3$ and R$^4$ are independently H or alkyl groups of one to six carbon atoms.

16. The method of claim 1 comprising surfactants of the formula:

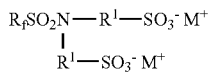

wherein $R_f$ is a $C_1$ to $C_{12}$ perfluoroalkyl group,
R$^1$ is an alkylene of the formula —$C_nH_{2n}(CHOH)_o C_mH_{2m}$—, wherein n and m are independently 1 to 6, and o is 0 or 1, and is optionally substituted by a catenary oxygen or nitrogen group, and M$^+$ is a cation.

17. The method of claim 1 wherein said etch solution contacts said substrate for a time sufficient to achieve a predetermined degree of etching.

18. The method of claim 1 wherein said substrate is contacted by said solution in a predetermined pattern by masking preselected portions of said substrate.

* * * * *

UNITED STATES PATENT AND TRADEMARK OFFICE
CERTIFICATE OF CORRECTION

| | | |
|---|---|---|
| PATENT NO. | : 7,101,492 B2 | |
| APPLICATION NO. | : 11/081196 | |
| DATED | : September 5, 2006 | |
| INVENTOR(S) | : Michael J. Parent | |

It is certified that error appears in the above-identified patent and that said Letters Patent is hereby corrected as shown below:

Col. 1
Line 5, after "6,890,452" insert -- , --.

Col. 4
Line 53, delete "–R$_1$–SO$_3$–M+." and insert -- -R$^1$-SO$_3^-$M$^+$. --, therefor.

Col. 5
Line 42, delete "Rf" and insert -- R$_f$ --, therefor.

Col. 6
Line 12, delete "R$_f$–O–" and insert -- R$_f$-O$^-$ --, therefor.
Line 15, delete "R$_f$SO$_2$NR$^2$H" and insert -- R$_f$–SO$_2$NR$^2$H --, therefor.
Line 17, delete "R$_f$SO$_2$N$^-$R$^2$." and insert -- R$_f$–SO$_2$N$^-$R$^2$. --, therefor.

Col. 7, in (Eq. II)
Line 17, delete "R$_f$–SO$_2$N$^-$–R$^6$M$^+$" and insert -- R$_f$–SO$_2$N$^-$R$^6$M$^+$ --, therefor.

Col. 9
Line 17, delete "C4F$_9$SO$_2$F." and insert -- C$_4$F$_9$SO$_2$F. --, therefor.

Col. 10
Line 15, delete "C4F$_9$SO$_2$NH(C$_2$H$_1$OH)" and insert
 -- C$_4$F$_9$SO$_2$NH(C$_2$H$_4$OH) --, therefor.
Line 36, delete "C$_4$F$_9$SO$_2$NH(C$_2$H$_{40}$H)." and insert
 -- C$_4$F$_9$SO$_2$NH(C$_2$H$_4$OH). --, therefor.
Line 38, delete "C$_4$F$_9$SO$_2$NH(C$_2$H$_{40}$H)" and insert
 -- C$_4$F$_9$SO$_2$NH(C$_2$H$_4$OH) --, therefor.
Line 45, delete "C$_4$F$_9$SO$_2$NH(C$_2$H$_{40}$H)" and insert
 -- C$_4$F$_9$SO$_2$NH(C$_2$H$_4$OH) --, therefor.
Line 50, delete "C$_4$F$_9$SO$_2$N(C$_2$H$_1$OH)" and insert
 -- C$_4$F$_9$SO$_2$N(C$_2$H$_4$OH) --, therefor.
Line 51, delete "C$_4$F$_9$SO$_2$N(C$_2$H$_1$OH)" and insert
 -- C$_4$F$_9$SO$_2$N(C$_2$H$_4$OH) --, therefor.
Line 64, delete "C4F$_9$SO$_2$NH(C$_2$H$_4$OH)" and insert
 -- C$_4$F$_9$SO$_2$NH(C$_2$H$_4$OH) --, therefor.

UNITED STATES PATENT AND TRADEMARK OFFICE
CERTIFICATE OF CORRECTION

PATENT NO. : 7,101,492 B2
APPLICATION NO. : 11/081196
DATED : September 5, 2006
INVENTOR(S) : Michael J. Parent It is certified that error appears in the above-identified patent and that said Letters Patent is hereby corrected as shown below:

Col. 11
Line 58, after "$N(CH_3)_2$" insert -- . --.
Line 61, delete "$(CH_2)_3N+[CH_2C](CH_3)_2$" and insert
  -- $(CH_2)_3\mathbf{N^+}[CH_2\mathbf{CH\ (OH)CH_2SO_3}](CH_3)_2$ --, therefor.

Col. 12
Line 56, delete "$^1H\text{-}\mathbf{mm}$" and insert -- $^1H\text{-}\mathbf{nmr}$ --, therefor.

Col. 13
Line 1, delete "$C_4F_9SO_2N(C_2H_{40}H)$" and insert
  -- $C_4F_9SO_2N(C_2\mathbf{H_4}OH)$ --, therefor.
Line 2, delete "Mixture" and insert -- mixture --, therefor.

Signed and Sealed this

Twenty Second Day of April, 2008

JON W. DUDAS
*Director of the United States Patent and Trademark Office*